United States Patent [19]

Nishioka et al.

[11] 4,456,886

[45] Jun. 26, 1984

[54] CONTROL CIRCUIT FOR VOLTAGE CONTROLLED VARIABLE ATTENUATOR

[75] Inventors: Akira Nishioka; Yoshihiro Kawanabe; Hideki Fujimoto; Hiroyuki Takahori, all of Tokyo, Japan

[73] Assignee: Pioneer Electronic Corporation, Tokyo, Japan

[21] Appl. No.: 387,894

[22] Filed: Jun. 14, 1982

[30] Foreign Application Priority Data

Jun. 18, 1981 [JP] Japan .................................. 56-94448

[51] Int. Cl.³ .............................................. H03G 3/30
[52] U.S. Cl. .................................... 330/254; 330/256; 330/284; 330/145
[58] Field of Search ............... 330/254, 256, 283, 284, 330/145; 307/264; 328/142; 455/249

[56] References Cited

U.S. PATENT DOCUMENTS 3,582,807  6/1971  Addis .................................. 330/145

Primary Examiner—James B. Mullins
Assistant Examiner—Steven J. Mottola
Attorney, Agent, or Firm—Sughrue, Mion, Zinn, Macpeak and Seas

[57] ABSTRACT

A voltage controlled attenuator includes a control circuit having variable impedance means whose impedance varies in a stepwise fashion as an input voltage is varied. In this manner, the attenuation characteristic of the attenuator can be made to vary stepwise in slope or inclination to improve its efficacy for use as a volume control device in audio apparatus.

9 Claims, 6 Drawing Figures

CONTROL CIRCUIT FOR VOLTAGE CONTROLLED VARIABLE ATTENUATOR

BACKGROUND OF THE INVENTION

This invention relates to a control circuit for a voltage controlled variable attenuator, and more particularly to a control circuit for a variable attenuator which is adapted to be used as an electronic volume control device in an acoustic apparatus.

A typical example of a voltage controlled variable attenuator is shown in FIG. 1. This example is in the form of a differential amplifier having bipolar transistors $Q_1$ and $Q_2$, the emitters of which are commonly connected. A current source outputting a current $I_1$ is connected between the commonly connected emitters and a reference voltage—B, and the current $I_1$ is controlled in accordance with a control signal. More specifically, a control voltage $V_C$ is applied as a differential input of the differential amplifier for controlling its attenuation, and an attenuated output created at a collector resistor $R_l$ of the transistor $Q_1$ is delivered at an output terminal OUT of the differential amplifier.

The voltage controlled varible attenuator of the above described construction exhibits an $I_2/I_1$ (dB) versus control voltage $V_C$(mV) attenuation characteristic as shown in FIG. 2. Since the input-output transfer characteristic, that is, the characteristic between the base-emitter voltage $V_{BE}$ and the collector current $I_C$ of the differential transistors $Q_1$ and $Q_2$ is not linear, the output current $I_2$ is expressed as $$I_2 = I_1/\{1 + \exp(qV_C/kT)\} \tag{1}$$

wherein q represents the electric charge of an electron, k represents the Bolzmann constant, and T represents absolute temperature. Accordingly, when the control voltage $V_C$ varies in a linear manner, the output attenuation $I_2/I_1$ (in dB) expressed in the form of a logarithmic value also varies in a linear manner as shown in FIG. 2.

A variable attenuator of the above described attenuating characteristics would exhibit a somewhat unnatural auditory sensation when used as an electronic volume control device in an acoustic apparatus. Generally speaking, it is desirable that the volume control device have an operational characteristic exhibiting a large gain variation versus control voltage in its high attenuation range, while exhibiting a small gain variation versus a control voltage in its low attenuation range. The operational characteristic of the circuit shown in FIG. 1, however, is as shown in FIG. 2, which shows a substantially linear variation in the attenuation of the control voltage throughout the entire range of operation, thus rendering an unnatural auditory sensation.

Furthermore, the input and output transfer characteristics of the bipolar transistors $Q_1$ and $Q_2$ are varied according to temperature variations of the transistors, and therefore the attenuation characteristics of the circuit shown in FIG. 1 are varied according to temperature as shown by a dashed line (for 75° C.) and an x-dash line (for $-25°$ C.), such a feature constituting a drawback of the conventional circuit.

SUMMARY OF THE INVENTION

An object of the present invention is to provide a control circuit for controlling a variable attenuator of the differential amplifier type so that the attenuator is adapted to be used as a volume control device in an acoustic apparatus.

Another object of the invention is to provide a control circuit for controlling a variable attenuator of the above described type so that any temperature variation in the attenuation characteristics can be substantially compensated for.

According to the present invention, there is provided a control circuit for a voltage controlled variable attenuator of a type including a differential amplifier, characterized in that the control circuit includes level control means which exhibits an input/output transfer characteristic such that the inclination of the characteristic is varied stepwise in response to a variation in level of an input signal, and such that the output of the level control means is applied to the differential amplifier as its control voltage.

In a preferred embodiment of the invention, the level control means are made of temperature compensating elements such as diodes and the like, which are operable in a manner such that any variation in the operational characteristics of the transistors in the differential amplifier caused by a temperature variation can thereby be compensated for.

BRIEF DESCRIPTION OF THE DRAWINGS

The invention will now be described in detail with reference to the accompanying drawings; in which.

DETAILED DESCRIPTION OF THE PREFERRED EMBODIMENTS

Figure 3:
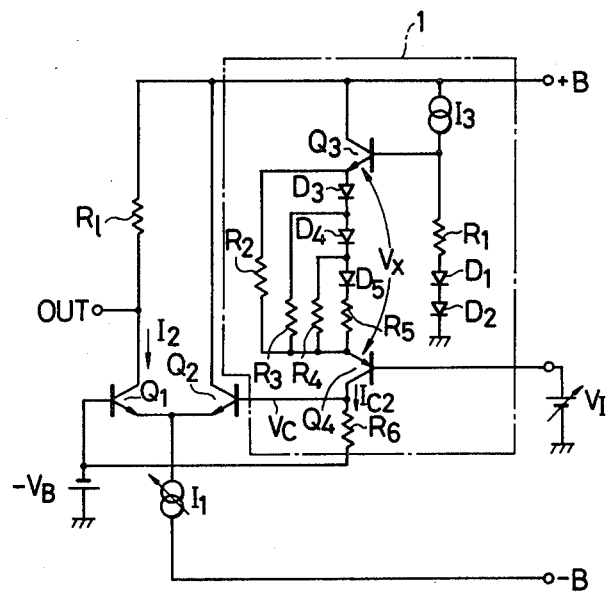
FIG. 3 is a circuit diagram showing an embodiment of this invention.
Figure 4:
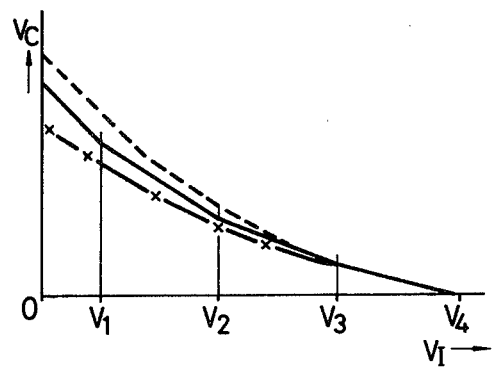
FIG. 4 is an input/output characteristic of the level control circuit of FIG. 3.

FIG. 3 shows an example of a variable attenuator utilizing a control circuit 1 according to the present invention. The control circuit 1 in this example constitutes a level control circuit which receives a control signal $V_I$ which is variable as shown in FIG. 4, and delivers an output voltage $V_C$ also variable depending on the input control signal $V_I$. More specifically, the level control circuit has an input/output transfer characteristic and hence an inclination of the output characteristic curve which is stepwisely variable as shown in FIG. 4.

The level control circuit includes, for instance, a transistor $Q_3$ of NPN type having a base connected with a bias circuit comprising diodes $D_1$ and $D_2$ and a resistor $R_1$, all connected in series. When a constant current $I_3$ flows through the bias circuit, the base of the transistor $Q_3$ is maintained at a constant voltage of $I_3R + 2V_D$, wherein $V_D$ represents the forward voltage across the diode. The level control circuit includes another transistor $Q_4$ of PNP type having a base connected to receive the input control signal $V_I$. A variable impedance circuit is connected between the emitters of the two transistors $Q_3$ and $Q_4$.

The variable impedance circuit changes its impedance (or resistance) in a stepwise manner depending on a voltage $V_X$ applied across the same. One example of such a circuit may comprise diodes $D_3$, $D_4$ and $D_5$ and a resistor $R_5$ series connected between the emitters, a resistor $R_2$ parallel connected between the emitters, a resistor $R_3$ connected between a junction point between the diodes $D_3$ and $D_4$ and the emitter of the transistor $Q_4$, and still another resistor $R_4$ connected between the junction point between the diodes $D_4$ and $D_5$ and the emitter of the transistor $Q_4$. Furthermore, a current flowing through the variable impedance circuit, equal to the collector current $I_{C2}$ flowing through the transistor $Q_4$, is passed through a resistor $R_6$ connected between the bases of the two transistors $Q_1$ and $Q_2$ of the differential amplifier, so that the voltage $V_C$ established across the resistor $R_6$ is utilized as the attenuation control voltage of the differential amplifier.

In the above described arrangement, if it is assumed that the base-mirror voltages of the two transistors $Q_3$ and $Q_4$ are both equal to a voltage $V_{BE}$, the voltage $V_X$ between the emitters of the transistors $Q_3$ and $Q_4$ can be expressed as $$V_X = I_3 \cdot R_1 + 2V_D - 2V_{BE} - V_I \quad (1)$$

In the case where $V_D$ is nearly equal to $V_{BE}$, Eqn (1) simplifies to $$V_X \approx I_3 \cdot R_1 - V_I \quad (2)$$

which shows that $V_X$ is responsive to the input control signal $V_I$.

Furthermore, the base-to-base voltage $V_C$ of the transistors $Q_1$ and $Q_2$ may be expressed as $$V_C = I_{C2} \cdot R_6 \quad (3)$$

Assuming that Z represents the impedance of the variable impedance circuit comprising the diodes $D_3$, $D_4$ and $D_5$ and resistors $R_2$, $R_3$, $R_4$ and $R_5$, $$I_{C2} = (V_X/Z) \quad (4)$$

Thus the control voltage $V_C$ defined by Eqn. (3) can be expressed as $$V_C = R_6(V_X/Z) \quad (5)$$

Substituting relation (2), Eqn. (5) can be rewritten $$V_C = R_6(I_3 \cdot R_1 - V_I)/Z \quad (6)$$

In the case where the input control voltage $V_I$ is small enough so that $V_X = 3V_D$ is satisfied, the diodes $D_3$, $D_4$ and $D_5$ all conduct, and therefore the impedance Z of the variable impedance circuit is made equal to a minimum value. Thus, it is apparent from Eqn. (6) that when the input control signal $V_I$ is in the range of $0 \leq V_I \leq V_1$ satisfying the relation of $V_X > 3V_D$, the inclination of the curve relating $V_L$ and $V_C$ is made equal to a maximum value (FIG. 4).

When the level of the input control signal $V_I$ is brought into a range $V_1 < V_I \leq V_2$ satisfying a relation $3V_D > V_X > 2V_D$, only the diodes $D_3$ and $D_4$ conduct, and therefore the impedance Z of the variable impedance circuit is made substantially equal to the impedance (or resistance) of the resistors $R_2$, $R_3$ and $R_4$ connected in parallel, which is somewhat larger than the minimum value. As is apparent from Eqn. (6), the inclination of the curve relating $V_I$ and $V_C$ is thus made somewhat milder in this range than in the above described range.

When the input control signal $V_I$ is within ranges $V_2 < V_I \leq V_3$ and $V_3 < V_I \leq V_4$ satisfying relations $2V_D > V_X > V_D$ and $V_D > V_X$ respectively, only the diode $D_3$ is turned ON, or all of the diodes $D_3$ through $D_5$ are turned OFF, and therefore the impedance Z of the variable impedance circuit increases accordingly, thereby reducing the inclination of the curve relating $V_I$ and $V_C$. FIG. 4 is a graph of the input/output transfer characteristic clearly showing the above described relation.

Figure 5:
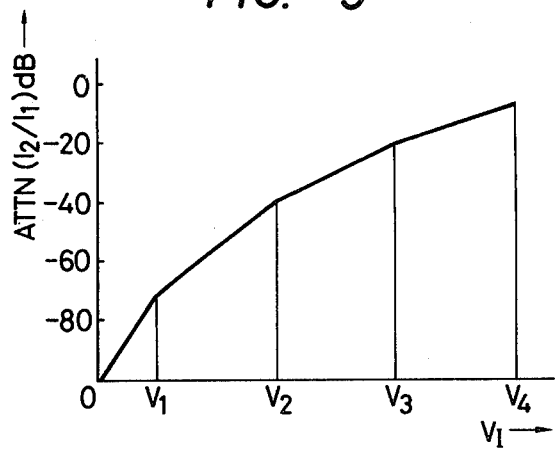
FIG. 5 is a diagram showing the attenuation characteristics of the circuit shown in FIG. 3.

By the application of the control voltage $V_C$ obtained as described above to the differential amplifier, an attenuation characteristic as shown in FIG. 5 can be obtained. As is apparent from FIG. 5, the variation rate of the gain of the amplifier is large for an input control voltage falling in a large attenuation range, while the variation rate of the gain is reduced to a smaller value for input control voltages falling in a range of small attenuation. Such a characteristic is well adapted for the requirements of a volume control device to be used in various acoustic apparatus.

Figure 1:
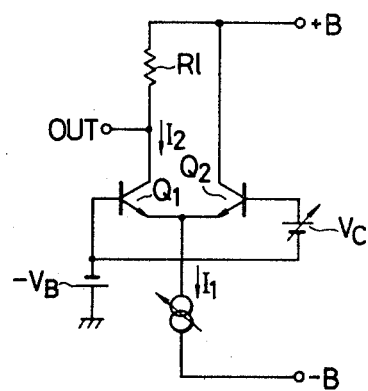
FIG. 1 is a circuit diagram of a voltage controlled variable attenuator.
Figure 2:
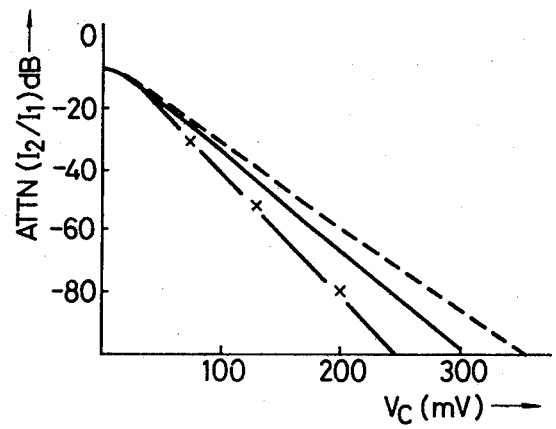
FIG. 2 is a diagram showing the attenuation characteristics of FIG. 1.

The impedance Z of the variable impedance circuit, to be more precise, includes the impedances of the diodes $D_3$, $D_4$ and $D_5$ turned on that time, which vary depending on the temperature. Thus, the aforementioned $V_I - V_C$ characteristic of the control circuit is varied by the temperature as indicated by a dash line (for 75° C.) and an x-dash line (for −25° C.) in FIG. 4. On the other hand, the input/output characteristic of the differential amplifier is varied in accordance with a temperature variation as shown in FIG. 2. For this reason, if the control voltage $V_C$ delivered from the control circuit is applied to the differential amplifier, the effect of the temperature variation on the control circuit and on the differential amplifier cancel each other, and an advantageous feature of temperature compensation can be thereby obtained.

Figure 6:
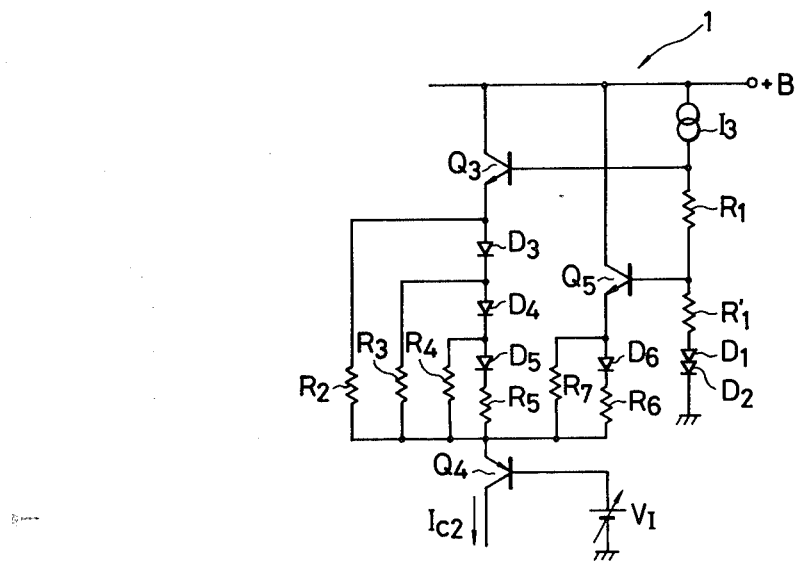
FIG. 6 is a circuit diagram showing another embodiment of the invention.

FIG. 6 illustrates another embodiment of the present invention wherein like parts are designated by like reference numerals. In the embodiment shown in FIG. 6, a transistor $Q_5$, a diode $D_6$ and resistors $R_1'$, $R_6$ and $R_7$ are further provided in addition to those shown in FIG. 3. A base bias circuit formed by the diodes $D_1$ and $D_2$ and the resistor $R_1'$ applies a constant voltage to the base of the transistor $Q_5$. The transistor $Q_5$ is thus operated in parallel with the variable impedance circuit comprising the diodes $D_3$, $D_4$ and $D_5$ and the resistors $R_2$ through $R_5$ so as to correct the inclination of the $V_I - V_C$ characteristic of the control circuit 1 as desired.

In the above described embodiments of the present invention, the constant current source $I_3$ may be made of high resistance elements, and the numbers of the diodes and resistors in the variable impedance circuit may be varied from those described hereinbefore. Although the invention has been described with reference to FIGS. 3 and 6, it is apparent that the invention is not restricted to such circuits. According to the present invention, there can be provided a voltage controlled variable attenuator which is simple in construction, easily manufactured in the form of an integrated circuit, and well adapted for the requirements of a volume control device, and an electronic volume control device affording a natural auditory sensation can be thereby obtained.

What is claimed is:

1. A control circuit for a voltage controlled variable attenuator of the type including a differential amplifier, the signal attenuating property of said voltage controlled variable attenuator being controlled by a control voltage applied to an input terminal of said differential amplifier and the attenuated output being obtained at an output terminal of said differential amplifier; said control circuit comprising level control means for receiving an input signal having a varying voltage level and outputting an output signal having inclinations which vary stepwisely in response to said voltage level variation of said input signal, wherein said output signal is applied to said input terminal of said differential amplifier as said control voltage.

2. A control circuit as set forth in claim 1, said level control means including variable impedance means, an impedance of said variable impedance means being varied stepwisely in response to a level variation of said input signal, a voltage corresponding to a current flowing through the variable impedance means being applied to said differential amplifier as said control voltage.

3. A control circuit as set forth in claim 2, wherein said level control means further includes a transistor of one conductivity type having a base biased at a constant voltage, and a further transistor of a second conductivity type reverse to that of the first mentioned transistor having a base connected to receive said input signal, said variable impedance means being connected between emitters of said two transistors.

4. A control circuit as set forth in claim 3, wherein said variable impedance means includes a plurality of diodes connected in series, and a plurality of resistors connected between respective junction points of said diodes and said emitter of said transistor of reversed conductivity type, said impedance varying stepwise as ones of said diodes are rendered conductive.

5. A control circuit as claimed in claim 4, including means for biasing said base of said transistor of one conductivity type comprising a plurality of series connected diodes.

6. A control circuit as claimed in claim 1, wherein said control circuit has a temperature variation characteristic which compensates for a temperature variation of said differential amplifier.

7. A control circuit as claimed in claim 6, said level control means including variable impedance means including at least a plurality of diodes.

8. A control circuit as claimed in claim 2, further including means for correcting said inclination of said level control means.

9. A control circuit as claimed in claim 8, said inclination correcting means being connected in parallel with said variable impedance means, and including a transistor having a base biased at a constant voltage.

* * * * *